United States Patent
Luo et al.

(10) Patent No.: US 11,675,273 B2
(45) Date of Patent: Jun. 13, 2023

(54) METHOD OF FABRICATING MICRO-NANO STRUCTURE

(71) Applicant: The Institute of Optics and Electronics, The Chinese Academy of Sciences, Sichuan (CN)

(72) Inventors: Xiangang Luo, Sichuan (CN); Yinghui Guo, Sichuan (CN); Mingbo Pu, Sichuan (CN); Xiong Li, Sichuan (CN); Xiaoliang Ma, Sichuan (CN); Ping Gao, Sichuan (CN)

(73) Assignee: The Institute of Optics and Electronics, The Chinese Academy of Sciences, Chengdu (CN)

( * ) Notice: Subject to any disclaimer, the term of this patent is extended or adjusted under 35 U.S.C. 154(b) by 0 days.

(21) Appl. No.: 17/997,102

(22) PCT Filed: Apr. 28, 2021

(86) PCT No.: PCT/CN2021/090554
§ 371 (c)(1),
(2) Date: Oct. 25, 2022

(87) PCT Pub. No.: WO2021/219005
PCT Pub. Date: Nov. 4, 2021

(65) Prior Publication Data
US 2023/0132100 A1    Apr. 27, 2023

(30) Foreign Application Priority Data
Apr. 29, 2020   (CN) .................. 202010354559.X

(51) Int. Cl.
G03F 7/20    (2006.01)
G03F 7/00    (2006.01)
G03F 7/16    (2006.01)

(52) U.S. Cl.
CPC .......... *G03F 7/70433* (2013.01); *G03F 7/162* (2013.01); *G03F 7/168* (2013.01)

(58) Field of Classification Search
CPC ...... G03F 7/70433; G03F 7/162; G03F 7/168; G03F 7/0002; G03F 7/0017; B82Y 40/00;
(Continued)

(56) References Cited

U.S. PATENT DOCUMENTS

| 8,728,380 B2 | 5/2014 | Chou |
| 2006/0078807 A1 | 4/2006 | Chen |

(Continued)

FOREIGN PATENT DOCUMENTS

| CN | 1434349 A | 8/2003 |
| CN | 103488046 A | 1/2014 |

(Continued)

OTHER PUBLICATIONS

"Chinese Application Serial No. 202010354559.X, Office Action dated Feb. 1, 2021", w/English Translation, (dated Feb. 1, 2021), 12 pgs.

(Continued)

*Primary Examiner* — Mesfin T Asfaw
(74) *Attorney, Agent, or Firm* — Schwegman Lundberg & Woessner, P.A.

(57) ABSTRACT

Provided is a method of fabricating a micro-nano structure, including: forming a reflective layer and a fluid polymer layer sequentially on a surface of a substrate; pressurizing the substrate and a mask having a micro-nano pattern to attach to each other, squeezing the fluid polymer layer into a light-transmission area of the mask, and curing the fluid polymer layer; and exposing, wherein a fluid polymer in the light-transmission area is configured to sense light under a combined effect of a transmitted light and a light reflected by the reflective layer, such that a micro-nano structure is (Continued)

obtained. The method solves the problem of limited diffraction, improves the processing resolution by reducing the transmission loss of evanescent waves through reflective light field enhancement, and reduces the difficulty and cost of mask processing and pattern defects by using shallow pressurizing in combination with exposure.

15 Claims, 8 Drawing Sheets

(58) Field of Classification Search
CPC ........... B82Y 10/00; G11B 5/743; G11B 5/84; G11B 5/74; G11B 5/82; B29C 59/025; B29C 59/022; B29C 33/58; B29C 37/0075; B29C 2059/023; B29C 37/0067; H05K 3/12; Y10S 977/887; B81C 99/009; B30B 15/062; B30B 15/065; B81B 2201/051; B01L 3/502707
See application file for complete search history.

(56) References Cited

U.S. PATENT DOCUMENTS

| 2006/0152703 | A1 | 7/2006 | Yamaguchi et al. |
| 2009/0001634 | A1 | 1/2009 | Hiroshima |
| 2009/0317727 | A1 | 12/2009 | Beck |
| 2012/0056355 | A1* | 3/2012 | Cho ................. B82Y 40/00 264/446 |
| 2015/0253659 | A1 | 9/2015 | Inanami et al. |

FOREIGN PATENT DOCUMENTS

| CN | 106558477 A | 4/2017 |
| CN | 107561857 A | 1/2018 |
| CN | 109283788 A | 1/2019 |
| CN | 111522206 A | 8/2020 |
| JP | 2004335910 A | 11/2004 |
| JP | 2008044237 A | 2/2008 |
| JP | 2008516450 A | 5/2008 |
| JP | 2008539570 A | 11/2008 |
| JP | 2009010188 A | 1/2009 |
| JP | 2013069921 A | 4/2013 |
| JP | 2015169803 A | 9/2015 |
| WO | WO-2013096459 A1 | 6/2013 |

OTHER PUBLICATIONS

"International Application Serial No. PCT/CN2021/090554, International Search Report dated Aug. 5, 2021", w/ English Translation, (dated Aug. 5, 2021), 7 pgs.

"International Application Serial No. PCT/CN2021/090554, Written Opinion dated Aug. 5, 2021", w/ English Translation, (dated Aug. 5, 2021), 7 pgs.

"Japanese Application Serial No. 2022-551796, Office Action dated Apr. 11, 2023", w/ English Translation, (Apr. 11, 2023), 10 pgs.

* cited by examiner

METHOD OF FABRICATING MICRO-NANO STRUCTURE

CROSS-REFERENCE TO RELATED APPLICATION

This application is a U.S. National Stage Filing under 35 U.S.C. § 371 from International Application No. PCT/CN2021/090554, filed on Apr. 28, 2021, and published as WO2021/219005 on Nov. 4, 2021, which claims priority to Chinese Patent Application No. 202010354559.X, filed on Apr. 29, 2020; the benefit of priority of each of which is hereby claimed herein, and which applications and publication are hereby incorporated herein by reference in their entireties.

TECHNICAL FIELD

The present disclosure relates to a field of micro-nano fabricating technology, and in particular to a method of fabricating a micro-nano structure.

BACKGROUND

In recent years, a large number of research reports have indicated that an artificial structure with a micro-nano feature scale may greatly enhance performances of a micro-nano photonic device, a micro-nano electronic device, a micro-nano electromechanical system, a micro-nano energy source and a display device. As a basis for fabricating these micro-nano scale structures and devices, a requirement for low-cost, high-resolution, high-yield, and large-scale novel nano fabricating techniques/methods is extremely urgent.

Traditional micro-nano fabricating techniques are generally divided into three categories: direct writing, lithography, and imprinting. Although the direct-writing micro-nano fabricating technique has a high resolution, it has a low fabricating efficiency and thus is not applicable for large-scale mass production. The photolithography micro-nano fabricating technique has great technical advantages in terms of efficiency, material, and process compatibility, etc. However, due to a limitation of Rayleigh criterion theory, it is necessary to use an objective lens with a shorter exposure wavelength and a higher numerical aperture in order to improve an exposure resolution, which means an accompanying rising cost. The imprinting micro-nano fabricating technique is a low-cost fabricating technique developed in recent years. Since no exposure process is involved and a shape and a quality of a pattern are directly determined by a stamper, a processing resolution has no physical limit and proximity effect. However, due to a high fabricating cost of a high-resolution stamper, massive defects present in a replicated pattern, low accuracies of alignment and overlay, and the inability to fabricate a multi-layer micro-nano structure pattern, its large-scale popularization and application are restricted.

SUMMARY

Technical Problems to be Solved

In view of the above problems, the present disclosure provides a method of fabricating a micro-nano structure for at least partially solving the technical problems such as low processing efficiency, high fabricating cost, and massive pattern defects of traditional micro-nano fabricating techniques.

Technical Solutions

In an aspect of the present disclosure, a method of fabricating a micro-nano structure is provided, including: forming a reflective layer and a fluid polymer layer sequentially on a surface of a substrate; pressurizing the substrate and a mask having a micro-nano pattern to attach to each other, squeezing the fluid polymer layer into a light-transmission area of the mask, and curing the fluid polymer layer; and exposing, wherein a fluid polymer in the light-transmission area is configured to sense light under a combined effect of a transmitted light and a light reflected by the reflective layer, such that a micro-nano structure is obtained.

Further, the pressurizing the substrate and a mask having a micro-nano pattern to attach to each other includes: pressurizing the substrate and the mask having the micro-nano pattern to attach to each other through a precise pressure transfer, such that the fluid polymer layer is uniformly pressurized into the light-transmission area of the mask.

Further, in the pressurizing the substrate and the mask having the micro-nano pattern to attach to each other through a precise pressure transfer, a method of the precise pressure transfer includes piston-type mechanical transfer, piezoelectric actuator transfer, gas film transfer, and gas pressure transfer.

Further, before the pressurizing the substrate and a mask having a micro-nano pattern to attach to each other, the method further includes: leveling and contacting the substrate with the mask having the micro-nano pattern.

Further, the curing the fluid polymer in the light-transmission area further includes: placing the substrate in a developing solution for development, and removing the fluid polymer not sensing light and not cured, so as to obtain the micro-nano structure.

Further, a micro-nano pattern of the mask further includes an anti-adhesion layer, and a material of the anti-adhesion layer includes diamond-like carbon thin film or fluorine-doped silane.

Further, the fluid polymer layer is a high-resolution fluid polymer material, including fluorine-doped silicon-based copolymer or derivative, vinyl ether-based copolymer, acrylic-based copolymer, calixarene-based molecular glass, acetal polymer with high acid hydrolysis activity, or poly p-hydroxystyrene-based copolymer.

Further, a method of forming the reflective layer on the surface of the substrate includes molecular beam epitaxy in combination with low temperature annealing, co-sputtering, and high temperature sputtering.

Further, forming the fluid polymer layer on the surface of the substrate includes spin-coating the fluid polymer on a surface of the reflective layer to form the fluid polymer layer.

Further, the reflective layer includes a low-loss silver reflective layer and a low-loss aluminum reflective layer.

In another aspect of the present disclosure, a method of fabricating a micro-nano optical printing based on reflective light field enhancement is provided, including the following steps: step 1, depositing a low-loss reflective layer on a surface of a substrate; step 2, spin-coating a high-resolution fluid polymer material on a surface of the reflective layer; step 3, preparing an anti-adhesion layer on a surface of a micro-nano mask; step 4, leveling and contacting, by a mechanical device, the substrate with the high-resolution fluid polymer material spin-coated on the surface of the reflective layer with a surface of a micro-nano mask pattern; step 5, squeezing, by using a method of precise pressure transfer, a shallow surface layer of the high-resolution fluid polymer material into a light-transmission area of the mask pattern; step 6, exposing, wherein a light field local passing through the mask pattern is located in the light-transmission area under an effect of the reflective layer, such that a local part of the fluid polymer material between the fluid polymer material squeezed into the light-transmission area of the mask pattern and the fluid polymer material reaching the reflective layer senses light and being cured; and step 7, placing the substrate into a developing solution for development after demolding to remove the fluid polymer material not sensing light and not cured, so as to obtain a replicated pattern.

Further, a method of fabricating the low-loss reflective layer in step 1 is molecular beam epitaxy in combination with low temperature annealing, co-sputtering, or high temperature sputtering.

Further, the high-resolution fluid polymer material in step 2 is a fluorine-doped silicon-based copolymer or derivative, a vinyl ether-based copolymer, an acrylic-based copolymer, calixarene-based molecular glass, an acetal polymer with high acid hydrolysis activity, or a poly p-hydroxystyrene-based copolymer.

Further, the anti-adhesion layer in step 3 is a diamond-like carbon thin film or a fluorine-doped silane.

Further, the method of precise pressure transfer in step 5 is piston-type mechanical transfer, piezoelectric actuator transfer, gas film transfer, or gas pressure transfer.

Beneficial Effects

A method of fabricating a micro-nano structure provided by the present disclosure improves the processing resolution by reducing the transmission loss of evanescent waves through reflective light field enhancement, thereby solving the problem of limited diffraction. Shallow pressurizing in combination with exposure is used, and the depth of the pattern is mainly determined by a depth of exposure, thereby reducing the difficulty and cost of mask processing. In addition, the pattern squeezed into the mask is shallow, and the depth of the pattern is mainly increased by exposure, thereby greatly reducing pattern defects.

REFERENCE NUMERALS

1—ultraviolet illumination light source;
2—mask;
3—micro-nano pattern;
4—anti-adhesion layer;
5—light-transmission area;
6—fluid polymer layer;
7—reflective layer; and
8—substrate.

DETAILED DESCRIPTION OF EMBODIMENTS

In order to make objectives, technical solutions and advantages of the present disclosure clearer, the present disclosure will be described in further detail below in combination with specific embodiments and with reference to the accompanying drawings.

The Embodiments of the present disclosure provide a method of fabricating a micro-nano structure, where a reflective layer is formed on a substrate, and a method of shallow pressurizing in combination with exposure is used so as to propose a method of fabricating micro-nano optical print based on reflective light field enhancement, thereby providing a technical support for solving the aforementioned problems.

Figure 1:
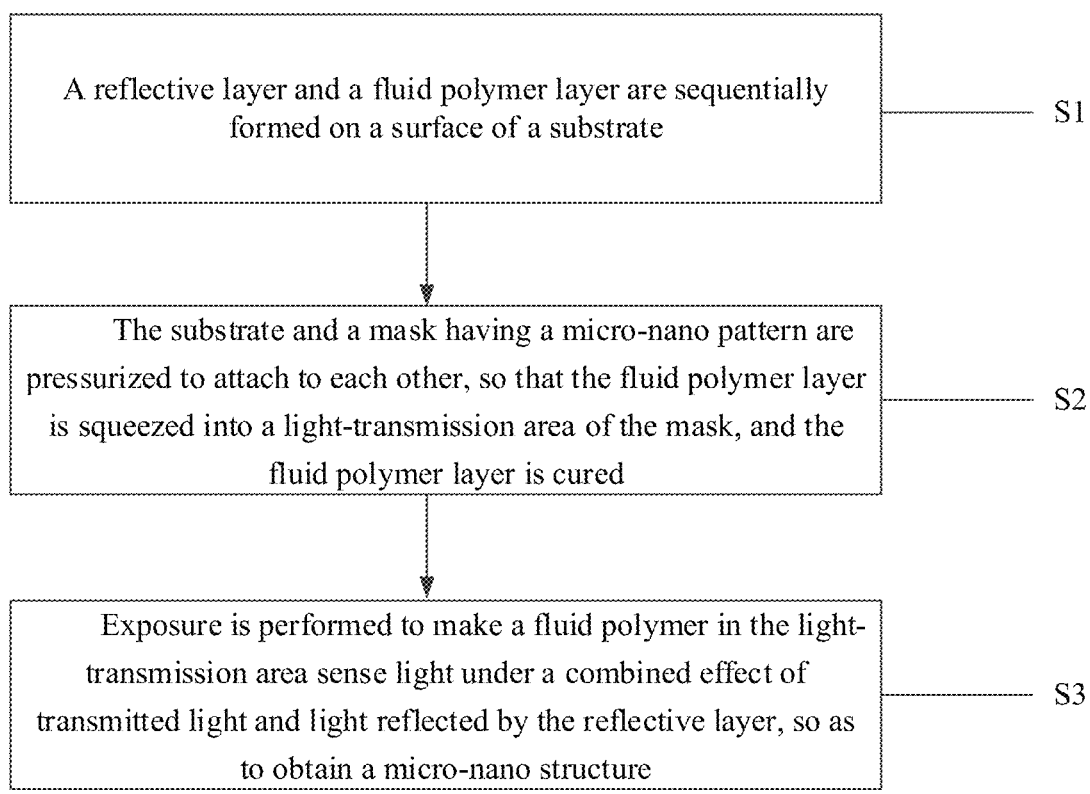
FIG. 1 schematically shows a schematic flow chart of a method of fabricating a micro-nano structure according to an embodiment of the present disclosure.

FIG. 1 schematically shows a schematic flow chart of a method of fabricating a micro-nano structure according to an embodiment of the present disclosure.

In S1, a reflective layer 7 and a fluid polymer layer 6 are sequentially formed on a surface of a substrate 8.

Figure 2:
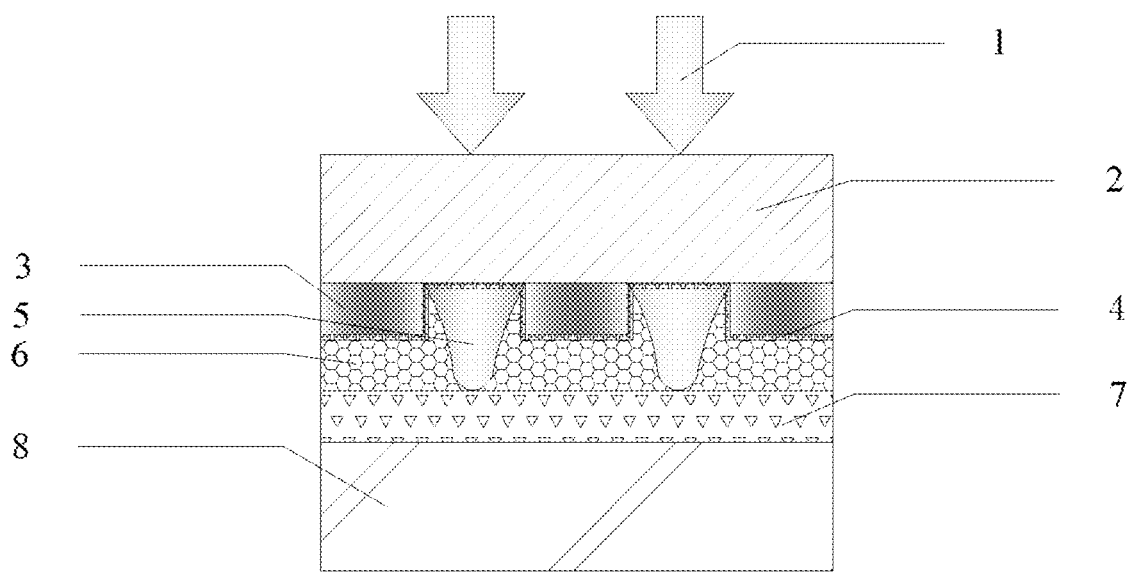
FIG. 2 schematically shows a schematic diagram of fabricating a micro-nano structure according to an embodiment of the present disclosure.
Figure 3:
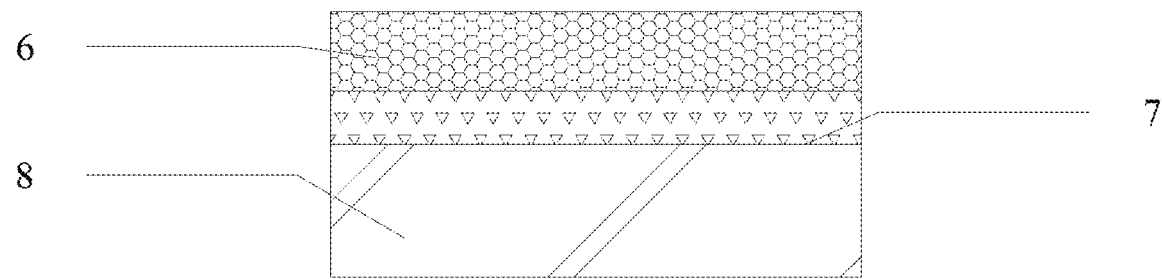
FIG. 3 schematically shows a schematic diagram of a sectional structure after a reflective layer is deposited and a fluid polymer material is spin-coated on a surface of a substrate according to an embodiment of the present disclosure.

FIG. 2 schematically shows a schematic diagram of fabricating a micro-nano structure according to an embodiment of the present disclosure. Referring to FIG. 3, a layer of low-loss reflective layer 7 is deposited on the surface of the substrate 8; and then a high-resolution fluid polymer material is spin-coated on a surface of the reflective layer 7. During ultraviolet light exposure, the reflective layer 7 may reflect transmitted ultraviolet light to make the fluid polymer 6 in a transmission area sense light, so as to reduce a transmission loss of evanescent waves. In this way, a processing resolution is improved, it is not necessary to shorten an exposure wavelength and increase a numerical aperture of an objective lens, thereby reducing a production cost. The fluid polymer material of the fluid polymer layer 6 has a high resolution and is applicable for fabricating a micro-nano structure.

In S2, the substrate 8 and a mask 2 having a micro-nano pattern are pressurized to attach to each other, so that the fluid polymer layer 6 is squeezed into a light-transmission area 5 of the mask, and the fluid polymer layer 6 is cured.

Figure 4:
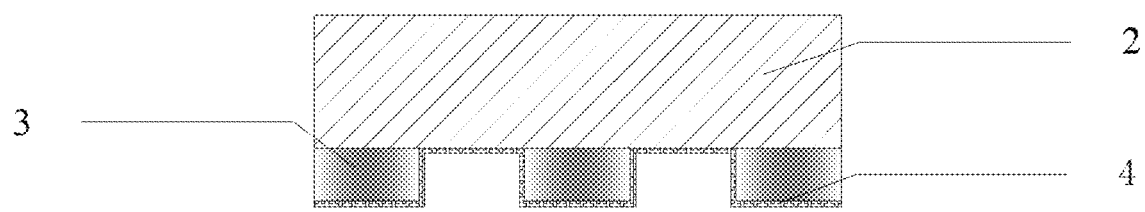
FIG. 4 schematically shows a schematic diagram of a sectional structure after an anti-adhesion layer is fabricated on a surface of a mask according to an embodiment of the present disclosure.

FIG. 4 is a schematic diagram of a sectional structure of the mask 2 having the micro-nano pattern. In traditional imprinting micro-nano fabricating techniques, during an imprinting process, an imprinting adhesive is squeezed into a stamper and then a pattern is formed by thermal curing or ultraviolet curing, a depth of the pattern is determined by the stamper, and thus the stamper is difficult to fabricate and a cost is relatively high. However, in the present disclosure, a method of shallow pressurizing in combination with exposure is used, and the depth of the pattern is mainly determined by an exposure depth, thereby reducing a difficulty and a cost of mask processing. In addition, it is necessary to ensure a certain aspect ratio of an imprint pattern. A pattern structure inevitably fails to be detached from the stamper due to a force during a demolding process, resulting in pattern defects. However, in the method of the present disclosure, the pattern squeezed into the mask is shallow, and the depth of the pattern is mainly increased by exposure, thereby greatly reducing the pattern defects.

Figure 6:
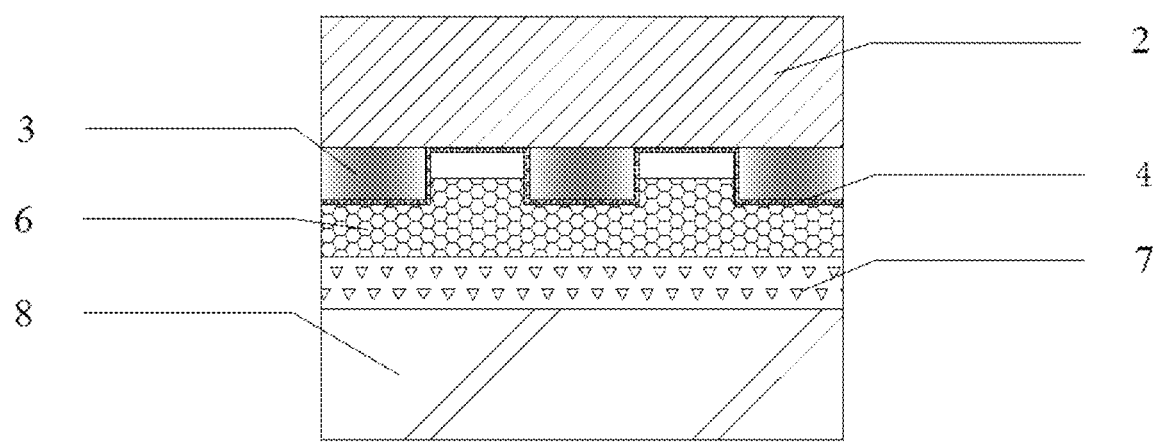
FIG. 6 schematically shows a schematic diagram of a sectional structure after a shallow surface layer of a fluid polymer material is squeezed into a light-transmission area of a mask pattern according to an embodiment of the present disclosure.

It should be noted that, here, squeezing the fluid polymer layer 6 into the light-transmission area 5 of the mask by pressurizing does not mean that the fluid polymer layer 6 completely fills the entire light-transmission area 5, but partially fills the light-transmission area 5 of the mask. Referring to FIG. 6, there is still a certain gap between the fluid polymer layer 6 and a base of the mask 2 after squeezing. A requirement for a high resolution of the stamper is reduced through shallow pressurizing, and a production cost of the stamper is reduced. At the same time, since the pattern squeezed into the mask is shallow, pattern defects caused by uneven force applied during a process of the stamper detaching from the substrate 8 are reduced.

In S3, exposure is performed to make a fluid polymer in the light-transmission area sense light under a combined effect of transmitted light and light reflected by the reflective layer, so as to obtain a micro-nano structure.

Figure 8:
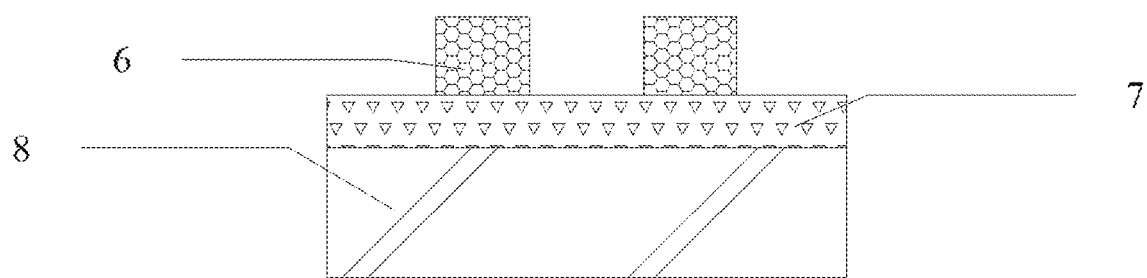
FIG. 8 schematically shows a schematic diagram of a sectional structure of a replicated pattern obtained after development according to an embodiment of the present disclosure.

The exposure is performed by using a ultraviolet illumination light source above the mask 2. An area 3 with a mask pattern on the mask 2 is opaque, and an area without the mask pattern 3 is the light-transmission area 5. Light beams pass through the light-transmission area, so that the fluid polymer layer 6 in the light-transmission area senses light. At the same time, a part of the light is reflected by the reflective layer 7 on the substrate 8, and the fluid polymer layer 6 proximate to the reflective layer 7 also senses light. Reference numeral 5 in FIG. 2 shows a localized light field obtained by simulation, whose shape is similar to an hourglass shape. The use of the reflective layer 7 reduces the transmission loss of evanescent waves, so that the processing resolution is improved. FIG. 8 is a schematic diagram of a sectional structure of a replicated pattern obtained after development, that is, a section of an obtained micro-nano structure.

On the basis of the above-mentioned embodiment, pressurizing the substrate 8 and the mask 2 having the micro-nano pattern to attach to each other includes: pressurizing the substrate 8 and the mask 2 having the micro-nano pattern to attach to each other through precise pressure transfer, such that the fluid polymer layer 6 is uniformly pressurized into the light-transmission area 5 of the mask.

In order to squeeze a shallow surface layer of the fluid polymer material into the light-transmission area of the mask pattern, it is necessary to precisely control a squeezing depth. By means of pressure transfer, the fluid polymer layer 6 may be uniformly pressurized into the light-transmission region 5 with a controllable depth.

On the basis of the above-mentioned embodiment, the substrate 8 and the mask 2 having the micro-nano pattern through precise pressure transfer are pressurized to attach to each other, a method of precise pressure transfer includes: piston-type mechanical transfer, piezoelectric actuator transfer, gas film transfer, and gas pressure transfer.

The piston-type mechanical transfer is precisely controlled to transfer pressure to the substrate 8 through a reciprocating motion of a piston unit, so as to pressurize the substrate 8 to attach to the mask 2. The piezoelectric actuator transfer is pressure transfer based on a piezoelectric effect, in which a measured pressure is transferred to a piezoelectric element by a membrane, then the piezoelectric element outputs an electrical signal having a certain relationship with the measured pressure, thereby precisely controlling the pressure applied to the substrate. The gas film transfer is that a certain gas pressure difference is generated when an inner pressure of a gas film is greater than an outer pressure of the gas film, such that the gas in the gas film may support a film material to apply pressure on the substrate. Gas pressure transfer is to increase the pressure by compressing the gas, so as to apply pressure to the substrate. The above methods may control a magnitude of the pressure applied to the substrate, with a uniform distribution of the applied pressure on a surface of the substrate, thereby realizing a precise control of the squeezing depth, such that the finally obtained micro-nano structure has the high resolution.

On the basis of the above-mentioned embodiment, before the substrate 8 and the mask 2 having the micro-nano pattern are pressurized to attach to each other, the method further includes: the substrate 8 and the mask 2 having the micro-nano pattern are leveled and brought into contact with each other.

Figure 5:
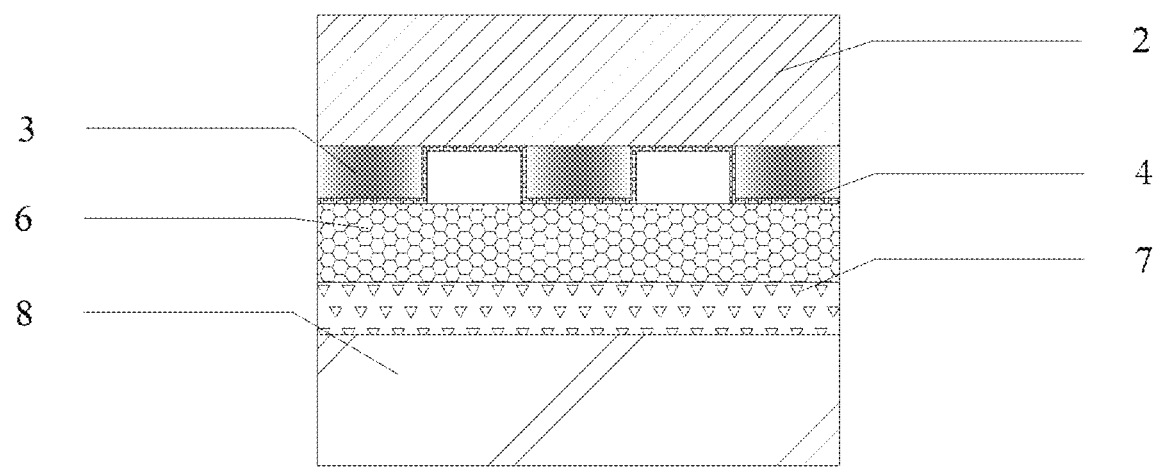
FIG. 5 schematically shows a schematic diagram of a sectional structure after a substrate whose reflective layer surface is spin-coated with a fluid polymer material is leveled and brought into contact with a micro-nano mask pattern surface according to an embodiment of the present disclosure.

Referring to FIG. 5, before being pressurized to attach to each other, the substrate 8 with the high-resolution fluid polymer material spin-coated on a surface of the reflective layer 7 and a surface of the micro-nano mask pattern are required to be leveled and brought into contact with each other by a mechanical device, so as to avoid pattern defects caused by non-uniform depth of the pressed fluid polymer 6 due to the uneven contact surface.

On the basis of the above-mentioned embodiment, curing the fluid polymer in the light-transmission area further includes: the substrate 8 is placed in a developing solution for development, and the fluid polymer not sensing light and not cured is removed so as to obtain the micro-nano structure.

Figure 7:
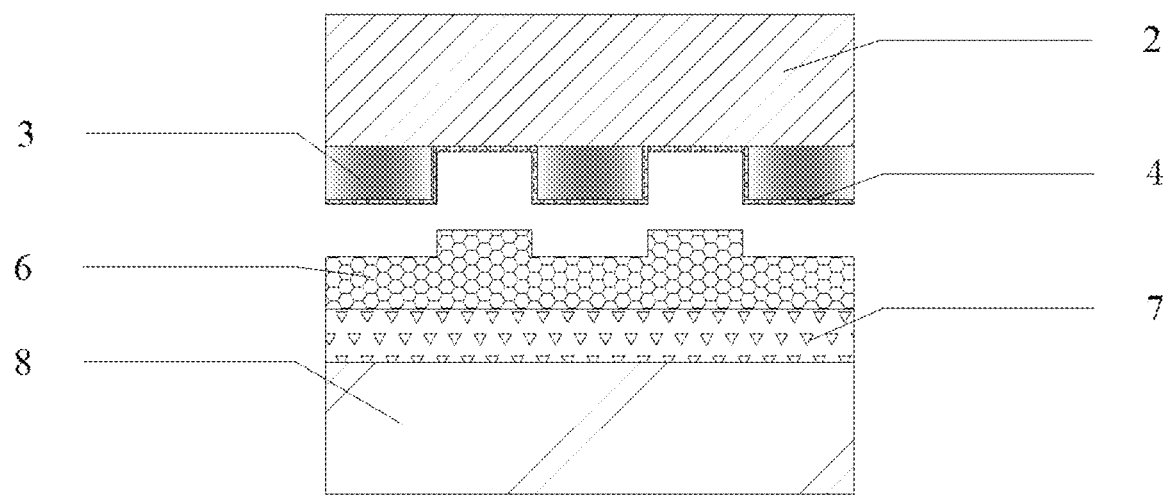
FIG. 7 schematically shows a schematic diagram of a sectional structure of demolding after an exposure is completed according to an embodiment of the present disclosure.

FIG. 7 is a schematic diagram of a sectional structure of demolding after the exposure is completed. The substrate is placed into the developing solution for development after demolding, and the polymer material not sensing light and not cured is removed. The polymer material not sensing light and not cured is mainly located between the mask pattern area 3 and the reflective layer 7. That is, the area with the mask pattern is replicated to the substrate 8, and the remaining pattern is the light-transmission area of the mask 2, such that the replicated pattern is finally obtained on the substrate, thereby realizing a transfer of the pattern from the mask 2. FIG. 8 is a schematic diagram of a sectional structure of a replicated pattern obtained after development.

On the basis of the above-mentioned embodiment, the micro-nano pattern 3 of the mask 2 also includes an anti-adhesion layer 4, and a material of the anti-adhesion layer 4 includes a diamond-like carbon thin film and a fluorine-doped silane.

FIG. 4 is a schematic diagram of a sectional structure after an anti-adhesion layer 4 is fabricated on a surface of a micro-nano mask. The diamond-like carbon thin film combines excellent properties of diamond and graphite. Here, the diamond-like carbon thin film is used as the anti-adhesion layer due to its high hardness and good optical transparency, thus the diamond-like carbon thin film is difficult to adhere to the fluid polymer layer 6 and does not affect a subsequent exposure process. Since fluorine-containing polysiloxane has characteristics of low surface energy, solvent resistance, flexibility, high and low temperature resistance, and possesses good hydrophobicity, oleophobicity, and stain resistance properties, thus anti-adhesion properties of the mask 2 may be improved.

On the basis of the above-mentioned embodiment, the fluid polymer layer 6 is a high-resolution fluid polymer material, including a fluorine-doped silicon-based copolymer or derivative, a vinyl ether-based copolymer, an acrylic-based copolymer, calixarene-based molecular glass, an acetal polymer with high acid hydrolysis activity, and a poly p-hydroxystyrene-based copolymer.

In order to prepare a high-resolution micro-nano structure, generally, there are certain requirements for material properties of the fluid polymer material. For example, the requirements include a resolution being less than 100 nanometers, a viscosity being less than $5 \times 10^{-3}$ Pas, a molecular weight being less than 40, a contrast ratio being greater than 4, etc. The fluid polymer layer 6 of the present disclosure may be made of materials such as a fluorine-doped silicon-based copolymer or derivative, a vinyl ether-based copolymer, an acrylic-based copolymer, calixarene-based molecular glass, an acetal polymer with high acid hydrolysis activity, and a poly p-hydroxystyrene-based copolymer.

On the basis of the above-mentioned embodiment, the method of forming the reflective layer 7 on the surface of the substrate 8 includes: molecular beam epitaxy combined with low temperature annealing, a co-sputtering method, and a high temperature sputtering method.

The reflective layer 7 is usually made of a metal or metal alloy, which is mainly deposited by means of vacuum coating and sputtering. The molecular beam epitaxy may be used to prepare single crystal thin films as thin as dozens of atomic layers, a growth quality is high, so that a high-quality reflective layer 7 is easily obtained. The sputtering has advantages of easy control, large coating area, strong adhesion, etc., so that the high-quality reflective layer 7 is also easily obtained.

On the basis of the above-mentioned embodiment, the forming the fluid polymer layer 6 on the surface of the substrate 8 includes: the fluid polymer is spin-coated on the surface of the reflective layer 7 to form the fluid polymer layer.

A main advantage of spin coating is that it is easy to obtain a dense coating with a relatively uniform coating thickness. Here, the use of spin-coating to form the fluid polymer layer 6 is mainly to obtain a coating with a uniform thickness, so as to ensure that a fluid to be squeezed has a consistent depth subsequently.

On the basis of the above-mentioned embodiment, the reflective layer 7 includes a low-loss silver reflective layer and a low-loss aluminum reflective layer.

Materials used for the reflective layer here include silver, silver alloys (such as an Ag—Pd alloy), aluminum, and aluminum alloys (such as an Al—Ti alloy). These materials all exhibit high reflectivity, which may minimize the transmission loss of the evanescent waves, and thus the processing resolution may be improved.

The present disclosure will be described below in detail in two specific embodiments.

Embodiment 1

An optical printing pattern with a line width resolution of 200 nm and a depth of 300 nm is fabricated. A specific fabricating process is as follows.

(1) A quartz substrate with a thickness of 0.35 mm is selected as a substrate; and a low-loss silver reflection layer with a thickness of 50 nm is deposited on a surface of the substrate by using a method of molecular beam epitaxy in combination with a low-temperature annealing coating.

(2) A layer of high-resolution fluid polymer material with a thickness of 300 nm is spin-coated on a surface of the silver reflective layer, which is equivalent to the aforementioned step S1.

(3) A uniform monomolecular anti-adhesion layer is formed on a surface of a chromium mask with a line width resolution of 200 nm by thermal evaporation.

(4) The substrate spin-coated with the high-resolution fluid polymer material and a chrome mask pattern surface with the line width resolution of 200 nm are leveled and brought into contact with each other by using a passive leveling mechanical structure.

(5) By applying a gas pressure of 0.2 MPa on a back surface of the substrate, a surface of the high-resolution fluid polymer material, with a thickness of the surface being 100 nm, is squeezed into a light-transmission area of the mask pattern and heated for curing, which is equivalent to the aforementioned step S2.

(6) An ultraviolet exposure light source with a central wavelength of 365 nm is turned on, and exposure is performed for 20 s at a power of 0.2 $mW/cm^2$; and under an effect of the reflective layer, a light field local passing through the mask pattern is located in the light-transmission area, such that a local part of the fluid polymer material between the fluid polymer material squeezed into the light-transmission area of the mask pattern and the fluid polymer material reaching the reflective layer senses light.

(7) After the exposure is completed, the substrate is detached from the mask to realize demoulding; the substrate is placed into a developing solution and developed for 20 s at a temperature of 22° C. so as to remove the fluid polymer material not sensing light and not cured, and an optical printing pattern with the resolution of 200 nm and the depth of 300 nm is obtained, which is equivalent to the aforementioned step S3.

Embodiment 2

An optical printing pattern with a line width resolution of 30 nm and a depth of 50 nm is fabricated. A specific fabricating process is as follows.

(1) A silicon wafer with a thickness of 0.21 mm is selected as a substrate; and a low-loss aluminum reflection layer with a thickness of 60 nm is deposited on a surface of the substrate by using a coating method of co-sputtering aluminum and copper.

(2) A layer of high-resolution fluid polymer material with a thickness of 50 nm is spin-coated on a surface of the aluminum reflective layer, which is equivalent to the aforementioned step S1.

(3) A uniform monomolecular anti-adhesion layer is formed on a surface of a molybdenum mask with a line width resolution of 30 nm by thermal evaporation.

(4) The substrate spin-coated with the high-resolution fluid polymer material and a platinum mask pattern surface with the line width resolution of 30 nm are leveled and brought into contact with each other by using a three-point active leveling system. Gap values of the three points are monitored and adjusted in real time during the leveling process.

(5) A pressure of 200N is applied on a back surface of the substrate by a piezoelectric actuator so that a surface of the high-resolution fluid polymer material, with a thickness of the surface being 20 nm, is squeezed into a light-transmission area of the mask pattern and heated for curing, which is equivalent to the aforementioned step S2.

(6) An ultraviolet exposure light source with a central wavelength of 365 nm is turned on, and exposure is performed for 10 s at a power of 0.2 mW/cm$^2$; and under an effect of the reflective layer, a light field local passing through the mask pattern is located in the light-transmission area, such that a local part of the fluid polymer material between the fluid polymer material squeezed into the light-transmission area of the mask pattern and the fluid polymer material reaching the reflective layer senses light.

(7) After the exposure is completed, the substrate is detached from the mask to realize demoulding; the substrate is placed into a developing solution and developed for 40 s at a temperature of 0° C. so as to remove the fluid polymer material not sensing light and not cured, and an optical printing pattern with the resolution of 30 nm and the depth of 50 nm is obtained, which is equivalent to the aforementioned step S3.

Compared with the traditional direct-writing micro-nano fabricating techniques, although the method of the present disclosure also needs to fabricate the mask by direct-writing, micro-nano structures may be replicated in batches at low cost by using the mask, and the processing efficiency is much higher than that of the traditional direct-writing micro-nano fabricating techniques. Compared with the traditional lithography micro-nano fabricating techniques, the method of the present disclosure solves the problem of limited diffraction, and improves the processing resolution by reducing the transmission loss of evanescent waves through reflective light field enhancement, there is no need to shorten the exposure wavelength and improve the numerical aperture of the objective lens. Compared with the traditional imprint micro-nano fabricating techniques, in which during an imprinting process, the imprint glue is squeezed into the stamper and then the pattern is formed by thermal curing or ultraviolet curing, a depth of the pattern is determined by the stamper and thus the stamp is difficult to fabricate and the cost is high, the present method uses the shallow pressurizing in combination with the exposure, and the depth of the pattern is mainly determined by the depth of exposure, thereby reducing the difficulty and cost of mask processing. In addition, since it is necessary to ensure a certain aspect ratio of the imprint pattern, the pattern structure inevitably fails to be detached from the stamper due to the force during the demolding process, resulting in the pattern defects. However, in the method of the present disclosure, the pattern squeezed into the mask is shallow, and the depth of the pattern is mainly increased by exposure, thereby greatly reducing the pattern defects.

The specific embodiments described above further describe the objectives, technical solutions and beneficial effects of the present disclosure in detail. It should be understood that the above descriptions are merely specific embodiments of the present disclosure, and are not intended to limit the present disclosure. Any modification, equivalent replacement, improvement, etc. made within the spirit and principle of the present disclosure should be included within the protection scope of the present disclosure.

What is claimed is:

1. A method of fabricating a micro-nano structure, comprising:
   forming a reflective layer and a fluid polymer layer sequentially on a surface of a substrate;
   pressurizing the substrate and a mask having a micro-nano pattern to attach to each other, squeezing the fluid polymer layer into a light-transmission area of the mask, and curing the fluid polymer layer; and
   exposing, wherein a fluid polymer in the light-transmission area is configured to sense light under a combined effect of a transmitted light and a light reflected by the reflective layer, such that a micro-nano structure is obtained.

2. The method according to claim 1, wherein the pressurizing the substrate and a mask having a micro-nano pattern to attach to each other comprises:
   pressurizing the substrate and the mask having the micro-nano pattern to attach to each other through a precise pressure transfer, such that the fluid polymer layer is uniformly pressurized into the light-transmission area of the mask.

3. The method according to claim 2, wherein in the pressurizing the substrate and the mask having the micro-nano pattern to attach to each other through a precise pressure transfer, a method of the precise pressure transfer comprises piston-type mechanical transfer, piezoelectric actuator transfer, gas film transfer, and gas pressure transfer.

4. The method according to claim 1, wherein before the pressurizing the substrate and a mask having a micro-nano pattern to attach to each other, the method further comprises:
   leveling and contacting the substrate with the mask having the micro-nano pattern.

5. The method according to claim 4, wherein the curing the fluid polymer in the light-transmission area further comprises:
   placing the substrate in a developing solution for development, and removing the fluid polymer not sensing light and not cured, so as to obtain the micro-nano structure.

6. The method according to claim 1, wherein a micro-nano pattern of the mask further comprises an anti-adhesion layer, and a material of the anti-adhesion layer comprises diamond-like carbon thin film or fluorine-doped silane.

7. The method according to claim 1, wherein the fluid polymer layer is a high-resolution fluid polymer material, comprising fluorine-doped silicon-based copolymer or derivative, vinyl ether-based copolymer, acrylic-based copolymer, calixarene-based molecular glass, acetal polymer with high acid hydrolysis activity, or poly p-hydroxystyrene-based copolymer.

8. The method according to claim 1, wherein a method of forming the reflective layer on the surface of the substrate comprises molecular beam epitaxy in combination with low temperature annealing, co-sputtering, and high temperature sputtering.

9. The method according to claim 8, wherein forming the fluid polymer layer on the surface of the substrate comprises spin-coating the fluid polymer on a surface of the reflective layer to form the fluid polymer layer.

10. The method according to claim 8, wherein the reflective layer comprises a low-loss silver reflective layer and a low-loss aluminum reflective layer.

11. A method of fabricating a micro-nano optical printing based on reflective light field enhancement, comprising the following steps:
   step 1, depositing a low-loss reflective layer on a surface of a substrate;
   step 2, spin-coating a high-resolution fluid polymer material on a surface of the reflective layer;
   step 3, preparing an anti-adhesion layer on a surface of a micro-nano mask;

step 4, leveling and contacting, by a mechanical device, the substrate with the high-resolution fluid polymer material spin-coated on the surface of the reflective layer with a surface of a micro-nano mask pattern;

step 5, squeezing, by using a method of precise pressure transfer, a shallow surface layer of the high-resolution fluid polymer material into a light-transmission area of the mask pattern;

step 6, exposing, wherein a light field local passing through the mask pattern is located in the light-transmission area under an effect of the reflective layer, such that a local part of the fluid polymer material between the fluid polymer material squeezed into the light-transmission area of the mask pattern and the fluid polymer material reaching the reflective layer senses light and being cured; and step 7, placing the substrate into a developing solution for development after demolding to remove the fluid polymer material not sensing light and not cured, so as to obtain a replicated pattern.

12. The method according to claim 11, wherein a method of fabricating the low-loss reflective layer in step 1 is molecular beam epitaxy in combination with low temperature annealing, co-sputtering, or high temperature sputtering.

13. The method according to claim 11, wherein the high-resolution fluid polymer material in step 2 is a fluorine-doped silicon-based copolymer or derivative, a vinyl ether-based copolymer, an acrylic-based copolymer, calixarene-based molecular glass, an acetal polymer with high acid hydrolysis activity, or a poly p-hydroxystyrene-based copolymer.

14. The method according to claim 11, wherein the anti-adhesion layer in step 3 is a diamond-like carbon thin film or a fluorine-doped silane.

15. The method according to claim 11, wherein the method of precise pressure transfer in step 5 is piston-type mechanical transfer, piezoelectric actuator transfer, gas film transfer, or gas pressure transfer.

* * * * *